(12) United States Patent
Mieno

(10) Patent No.: US 9,525,046 B2
(45) Date of Patent: Dec. 20, 2016

(54) METAL GATE STACK STRUCTURE AND MANUFACTURING METHOD

(71) Applicant: SEMICONDUCTOR MANUFACTURING INTERNATIONAL (SHANGHAI) CORPORATION, Shanghai (CN)

(72) Inventor: Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 15 days.

(21) Appl. No.: 14/631,829

(22) Filed: Feb. 25, 2015

(65) Prior Publication Data
US 2015/0364563 A1    Dec. 17, 2015

(30) Foreign Application Priority Data
Mar. 17, 2014 (CN) .......................... 2014 1 0098617

(51) Int. Cl.
| | | |
|---|---|---|
| *H01L 21/00* | (2006.01) | |
| *H01L 29/10* | (2006.01) | |
| *H01L 29/66* | (2006.01) | |
| *H01L 29/786* | (2006.01) | |
| *H01L 27/146* | (2006.01) | |
| *H01L 31/105* | (2006.01) | |
| *H01L 29/49* | (2006.01) | |

(52) U.S. Cl.
CPC ..... *H01L 29/6675* (2013.01); *H01L 27/14692* (2013.01); *H01L 29/4908* (2013.01); *H01L 29/78663* (2013.01); *H01L 31/1055* (2013.01)

(58) Field of Classification Search
CPC ...................... H01L 29/6675; H01L 27/14692
USPC ...................... 257/E31.062, E29.08, 29.092, 29.101,257/29.191, 29.289, 21.297, 21.316, 21.412, 57,257/63, 52, 16; 438/96, 482
See application file for complete search history.

(56) References Cited

U.S. PATENT DOCUMENTS

| | | | | |
|---|---|---|---|---|
| 5,130,103 A * | 7/1992 | Yamagata | ............... | C30B 25/02 250/578.1 |
| 8,796,759 B2 * | 8/2014 | Perng | .................... | H01L 29/165 257/328 |
| 9,166,022 B2 * | 10/2015 | Xu | .................... | H01L 29/66795 257/329 |

* cited by examiner

*Primary Examiner* — Calvin Lee
(74) *Attorney, Agent, or Firm* — Kilpatrick Townsend and Stockton LLP

(57) ABSTRACT

A gate electrode and method for manufacturing the same includes an amorphous gate metal layer. The amorphous gate metal layer includes an amorphous metal alloy material layer having at least two metallic elements of an amorphous material or an amorphous metal compound material layer having at least one metallic element and at least one non-metallic element selected from the IIIA group, the IVA group, and the VA group of the Periodic Table. The atoms are arranged evenly in the amorphous gate metal layer, there is no noticeable grains and grain boundaries, so that no defects will be generated through a carrier recombination, and the carrier mobility is increased and the carrier can be uniformly distributed.

20 Claims, 2 Drawing Sheets

METAL GATE STACK STRUCTURE AND MANUFACTURING METHOD

CROSS-REFERENCES TO RELATED APPLICATIONS

This application claims priority to Chinese patent application No. 201410098617.1, filed Mar. 17, 2014, the content of which is incorporated herein by reference in its entirety.

BACKGROUND OF THE INVENTION

As the feature size of semiconductor devices continue to shrink, the dimension of the transistor gate dielectric layer has been reduced to a critical limit. For example, in the 65 nm process, the thickness of the gate dielectric layer has been reduced to 1-2 nm. If the dimension of the gate dielectric layer is further reduced, leakage current and power consumption of the transistor will increase dramatically. For 32 nm and below technology nodes, a high-k dielectric layer and a gate metal layer are being utilized to reduce the leakage current and power consumption. A high-k dielectric layer may include $HfO_2$, and a gate metal layer may include TiN.

However, a gate metal layer contains a large number of defects at grain boundaries, such as impurities, holes, etc. There are also defects such as excess charge present at the interface between the high-k gate dielectric layer and the gate metal layer.

In current techniques, after formation of the gate metal structure, a high temperature annealing of the high-k dielectric layer is carried out to reduce defects in the high-k dielectric layer and improve the uniform distribution of the threshold voltage. However, a high temperature annealing process may likely result in the evaporation of the gate metal structure and cause damage to the high-k dielectric layer and the gate metal layer.

BRIEF SUMMARY OF THE INVENTION

Embodiments of the present invention provide a gate electrode and method for manufacturing the same to solve the problems of non-uniform distribution of the threshold voltage.

In an embodiment, a gate electrode includes at least an amorphous gate metal layer. The amorphous gate metal layer includes an amorphous metal alloy material layer having at least two metallic elements of an amorphous material or an amorphous metal compound material layer having at least one metallic element and at least one non-metallic element selected from the IIIA group, the IVA group, and the VA group of the Periodic Table.

In an embodiment, the at least one metallic element is Ti, W, Cu, Al, Pd, Zr, La, or Ni. In an embodiment, the at least one non-metallic element is nitrogen, carbon, phosphorous, or silicon.

In an embodiment, the amorphous material includes at least three different types of atoms, each of the atoms has a different atomic radius. The percentage difference in atomic radii between any two atoms is greater than or equal to 10%.

In an embodiment, the amorphous metal alloy layer comprises ZrCuAl or TiAlW. The amorphous metal compound material layer comprises TiAlN, TiPC, TiPN, or WPC.

In an embodiment, the percentage content of atoms having the smallest radius is in a range between 10% and 40%, the percentage content of atoms having the largest radius is in a range between 5% and 15%, and the percentage content of atoms having an atomic radius between the smallest and largest radii is in a range 45% and 85% in the amorphous metal alloy material layer or in the amorphous metal compound material layer.

In an embodiment, the amorphous gate metal layer comprises a plurality of amorphous metal layers formed of the same material or different materials.

In an embodiment, the gate electrode further includes a gate dielectric layer disposed below the amorphous gate metal layer and a gate material layer disposed on the amorphous gate metal layer. The gate material layer includes polysilicon, Cu, or Al. The gate dielectric layer includes a high-k dielectric constant material, which may be $HfO_2$, HfON, HfSiON, $ZrO_2$, $La_2O_3$, or any combinations thereof.

Embodiments of the present invention also provide a method for manufacturing a semiconductor device. The method includes providing a substrate, forming a gate dielectric layer on the substrate, and forming an amorphous gate metal layer on the gate dielectric layer. Forming the amorphous gate metal layer may include forming an amorphous metal alloy material layer having at least two metallic elements of an amorphous material or forming an amorphous metal compound material layer having at least one metallic element and at least one non-metallic element selected from the IIIA group, the IVA group, and the VA group of the Periodic Table.

In an embodiment, forming the amorphous gate metal layer comprises atomic layer deposition or chemical vapor deposition. The atomic layer deposition may be carried out under conditions where the deposition temperature is in the range between 200 and 450 degrees C. and the deposition pressure is in the range between 0.1 and 6 Torr. The chemical vapor deposition may be carried out under conditions where the energy is in the range between 300 and 500 W, the deposition pressure in the range between 0.001 and 0.2 Torr, and the deposition temperature in the range between 200 and 500 degrees C.

The following description, together with the accompanying drawings, will provide a better understanding of the nature and advantages of the claimed invention.

DETAILED DESCRIPTION OF THE INVENTION

Figure 1A:
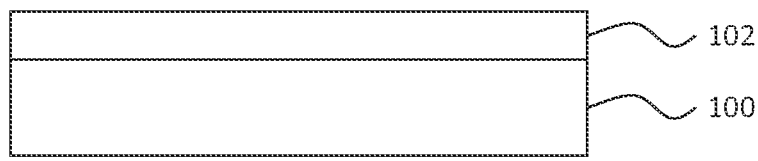
FIG. 1A is a cross-sectional view of a portion of a semiconductor device substrate after forming a gate dielectric layer, in accordance with an embodiment of the present invention.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as on (as in "sidewall"), "below", "higher", "lower", over and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A material may be described herein according to its crystalline structure or lack of crystalline structure. For example, a material may be described as "amorphous", which is defined as substantially lacking a crystalline structure.

The present invention will now be described more fully hereinafter with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

As described above, a conventional gate electrode has problems of non-uniform threshold voltage distribution. Embodiments of the present invention provide a gate electrode, which includes at least an amorphous metal layer. The amorphous metal layer includes an amorphous metal alloy layer or an amorphous metal compound layer. The amorphous metal alloy layer includes at least two metallic elements of amorphous material. The amorphous metal compound layer includes at least one metallic element and at least one non-metallic element selected from the IIIA main group, the IVA main group, or the VA main group.

Since the amorphous metal alloy layer of the gate electrode includes at least two different atoms, an amorphous material can be formed easily between the two different atoms that facilitates the formation of a uniform distribution of the amorphous gate metal layer. The amorphous material can be irregular (randomly) and evenly distributed between the different atoms in the amorphous metal layer, and no crystal grain boundaries exist, thus, there are relatively few defects caused by carrier recombination in the gate metal layer carrier mobility, and the carrier mobility is increased to solve issues of non-uniform distribution of the threshold voltage.

The above-described amorphous metal compound layer includes at least two metal elements of amorphous material. The metal element may be a transition metal or a main group metal. In an embodiment, the metal element is Ti, W, Cu, Al, Pd, Zr, La, or Ni. The non-metallic element is nitrogen, carbon, phosphorous, or silicon. Since the difference in the atomic radius between the non-metallic elements and the metal elements is relatively large, the thus formed structure of the amorphous metal material of the compound layer is uniform, to thereby improve the gate threshold voltage uniformity.

The amorphous material layer may be an amorphous metal compound comprising at least one metal element and at least one non-metallic element of the IIIA main group, the IVA main group, or the VA main group. In a specific embodiment, the metal element is Ti, W, Cu, Al, Pd, Zr, La, or Ni. The non-metallic element is nitrogen, carbon, phosphorous, or silicon. Since the percentage difference in atomic radii between the non-metallic elements and the metallic elements is relatively large, the formed structure of the amorphous metal compound is uniform to improve the uniform distribution of the gate threshold voltage.

In the above-described amorphous gate metal layer, the large the variety of atom types, the larger the percentage difference between the atomic radii of the metallic and non-metallic elements, the more uniform is the formed structure of the amorphous gate metal layer. In a specific embodiment, the amorphous material comprises at least three different atoms, the percentage difference in atomic radii between any two of the three atoms is greater than or equal to 10 percent (≥10%). In an embodiment, the amorphous metal alloy material layer is a ZrCuAl material layer or a TiAlW layer. The amorphous material layer is preferably a metal compound, including but not limited, the amorphous material layer TiAlN material layer, TiPC material layer, TiPN material layer, or WPC material layer.

The uniform structure of the amorphous gate metal layer is also related to the percentage content of the different types of atoms. In a specific embodiment, the percentage content of the elements having the smallest atomic radius in the amorphous alloy layer or in the amorphous metal compound material layer is 10% to 40%, the percentage content of the elements having the maximum atomic radius is 5% to 15%, the percentage content of the elements having an atomic radius between the minimum and maximum radius values is 45% to 85%. In the embodiment, the percentage content of the elements having the smallest atomic radius and the elements having the largest atomic radius is smaller than the percentage content of the elements having an atomic radius between the smallest and the largest atomic radius, so that the atoms having the smallest atomic radius and atoms having the largest atomic radius can be distributed among atoms having the atomic radius ranging between the smallest and the largest radii, to facilitate the formation of a homogeneous amorphous structure of a gate metal layer, and improve uniform distribution of the gate threshold voltage.

The amorphous gate metal layer may be a single layer or multiple layers. When the amorphous gate metal layer is a multi-layered structure, the structure of each amorphous gate metal layer is more uniform. In an embodiment, the different amorphous gate metal layers may have a same material or a different material.

The above-described gate electrode may further include a gate dielectric layer disposed below the amorphous gate metal layer. The gate dielectric layer comprises a material having a high dielectric constant (>4.5), preferably one of the $HfO_2$, HfON, HfSiON, $ZrO_2$, and $La_2O_3$. The gate dielectric layer has good insulating properties and is capable of forming a good contact interface with the amorphous gate metal layer.

In an embodiment, the gate electrode may further include a gate material layer on the amorphous gate metal layer. In this case, the amorphous gate metal layer is sandwiched between the gate material layer and the gate dielectric layer to reduce or eliminate defects such as excess charges present on the surface of the gate dielectric layer and the gate material layer. Preferably, the material of the gate material layer is polysilicon, Cu, or Al.

Figure 1B:
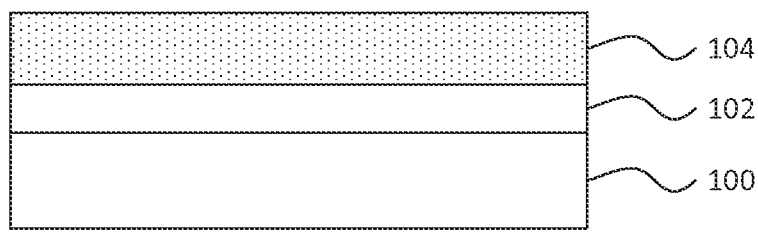
FIG. 1B is a cross-sectional view of FIG. 1A after forming an amorphous gate metal layer, in accordance with an embodiment of the present invention.
Figure 1C:
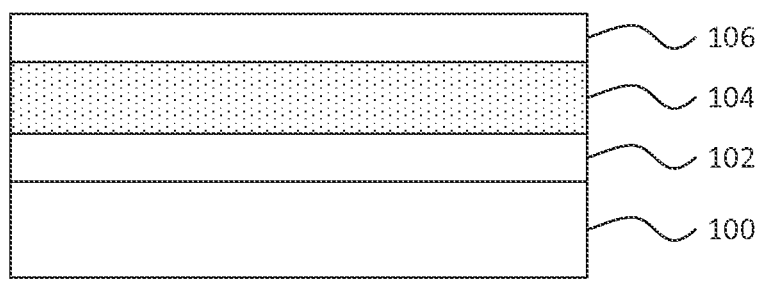
FIG. 1C is a cross-sectional view of FIG. 1B after forming a gate material layer, in accordance with an embodiment of the present invention.

FIG. 1A-FIG. 1C are schematic drawings illustrating a method of manufacturing a portion of a semiconductor device having a gate electrode according to preferred embodiments of the present invention. As shown in FIG. 1, a substrate 100 such as a silicon substrate, a silicon-containing substrate, or a silicon-on-insulator (SOI) substrate is provided. A gate dielectric layer 102 is formed on substrate 100. Gate dielectric layer 102 includes a high-k dielectric material and the high-k dielectric material is selected from the group consisting of $HfO_2$, HfON, HfSiON, $ZrO_2$, and $La_2O_3$ or any combination thereof. After forming gate dielectric layer 102, an amorphous gate metal layer 104 is formed on the gate dielectric layer, amorphous gate metal layer 104 may include an amorphous metal alloy material layer or an amorphous metal compound material layer. In an embodiment, the amorphous metal alloy layer contains at least two metallic elements of an amorphous material. The amorphous material may include at least three different types of atoms each having an atomic radius. The percentage difference in the atomic radii between any two atoms is greater than or equal to 10%. The percentage content of atoms having the smallest radius is in the range between 10% and 40%, the percentage content of atoms having the largest radius is in the range between 5% and 15%, and the percentage content of atoms having an atomic radius between the smallest and largest radii is in the range 45% and 85% in the amorphous metal alloy material layer. The amorphous metal alloy layer includes a ZrCuAl material or a TiAlW material.

Still referring to FIG. 1B, the amorphous metal compound material layer of amorphous gate metal layer 104 may include at least three different types of atoms, and the percentage difference in atomic radii of any two atoms is greater than or equal to 10%. The percentage content of atoms having the smallest radius is in the range between 10% and 40%, the percentage content of atoms having the largest radius is in the range between 5% and 15%, and the percentage content of atoms having an atomic radius between the smallest and largest radii is in the range 45% and 85% in the amorphous metal compound material layer. In an embodiment, the amorphous metal compound material layer contains a TiAlN material, a TiPC material, a TiPN material, or a WPC material.

Referring to FIG. 1C, after forming amorphous gate metal layer 104, a gate dielectric layer is formed on the amorphous gate metal layer. The gate dielectric layer may include polysilicon, Cu, or Al.

Embodiments of the present invention also provide a method for manufacturing a gate electrode. The method may include forming at least an amorphous gate metal layer. The amorphous gate metal layer includes an amorphous metal alloy material layer or an amorphous metal compound material layer. The amorphous metal alloy material layer is formed by an amorphous material comprising at least two metallic elements. The amorphous metal compound material layer is formed by an amorphous material comprising at least one metallic element and at least one non-metallic element of the IIIA main group, the IVA main group, or the VA main group. Atoms in the thus formed amorphous gate metal layer are randomly distributed, and no grain or grain boundary exists. Therefore, there are few defects through recombination of carriers, so that the carrier mobility increases, and the carriers can be uniformly distributed to solve the problems associated with uneven distribution of the threshold voltage.

The above-described amorphous gate metal layer is an amorphous metal alloy material layer or an amorphous metal compound material layer. In a specific embodiment, the amorphous metal alloy material layer includes ZrNiCu, ZrCuAl, or TiAlW. The amorphous metal compound material layer includes amorphous TiAlN, TiPC, TiPN, or WPC. The process of forming an amorphous gate metal layer includes, but not limited to, atomic layer deposition or chemical vapor deposition. In an embodiment, a chemical vapor deposition process for forming an amorphous gate metal layer can be carried out under conditions where the power can range from 300 W to 500 W, the pressure can range from 0.001 Torr to 0.2 Torr, the temperature can range from 200 to 500 degrees C. An atomic layer deposition for an amorphous gate metal layer can be carried out under conditions where the temperature can range from 200 to 450 degrees C. and the pressure can range from 0.1 Torr to 6 Torr. It should be noted that the amorphous gate metal layer may have multiple layers of amorphous materials. The material of the multiple layers may be the same or different.

In an embodiment, the method for manufacturing a gate electrode includes forming a gate dielectric layer and forming an amorphous gate metal layer on the gate dielectric layer. The gate dielectric layer includes a dielectric material having a high dielectric constant, preferably, one or more of $HfO_2$, HfON, HfSiON, $ZrO_2$, and $La_2O_3$. The process of forming the gate dielectric layer may include, but not limited to, chemical vapor deposition, sputtering, or atomic layer deposition. In an embodiment, the gate dielectric layer can be formed using an atomic layer deposition under the following conditions: using $HfCl_4$ and $H_2O$ as the reactive gas, $N_2$ as the carrier gas, the flow rate of $HfCl_4$ is in the range between 1 and 100 sccm, the flow rate of $H_2O$ is in the range between 1 and 100 sccm, the flow rate of $N_2$ is in the range between 1000 and 3000 sccm, the deposition chamber pressure is in the range between 0.1 and 6 Torr, and the deposition temperature is in the range between 200 and 500 degrees C.

After formation of the amorphous gate metal layer, a gate material layer is formed on the amorphous gate metal layer. In an embodiment, the material of the gate material layer is polysilicon, Cu, or Al. The process of forming the gate material layer may include, but not limited to, chemical vapor deposition and electroplating. In an embodiment, the gate material layer is formed by electroplating a Cu layer with a plating current of 6 to 30 A, and a plating time of 30 to 120 seconds.

Figure 2:
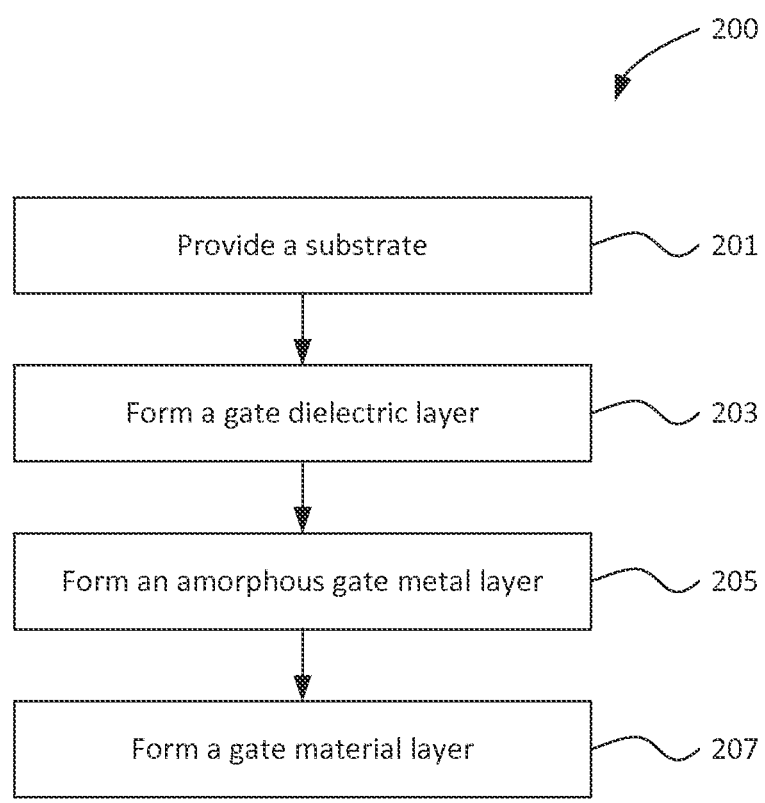
FIG. 2 is a flow chart of a method for manufacturing a gate electrode, in accordance with an embodiment of the present invention.

FIG. 2 is a flow chart of a method 200 of fabricating stages illustrating in FIG. 1A through FIG. 1C, according to embodiments of the present invention. As shown, method 200 starts with providing a substrate at 201, and forming a gate dielectric layer at 203. The gate dielectric layer may be a high-k dielectric material and includes $HfO_2$, HfON, HfSiON, $ZrO_2$, $La_2O_3$, or any combination thereof. Method 200 also includes forming an amorphous gate metal layer on the gate dielectric layer at 205. Forming the amorphous gate metal layer may include forming an amorphous metal alloy layer having at least two metallic elements of an amorphous material or forming an amorphous metal compound material layer having at least one metallic element and at least one non-metallic selected from the MA group, the IVA group, and VA group. The amorphous gate metal layer may be formed using atomic layer deposition or chemical vapor deposition. Method 200 further includes forming a gate material layer on the amorphous gate metal layer at 207.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

EXAMPLES

The following examples are provided for illustrative purposes only and are not intended to limit the scope of the disclosed embodiments or claims.

Example 1

Embodiments the present invention provide a method for manufacturing a gate electrode. The method includes forming a gate dielectric layer of hafnium oxide ($HfO_2$) over a substrate by atomic layer deposition in a deposition chamber using a reaction gas including $HfCl_4$ and $H_2O$ as reaction gases, $N_2$ as the carrier gas, the flow rate of $HfCl_4$ is about 100 sccm, the flow rate of $H_2O$ is about 100 sccm, the flow rate of $N_2$ is about 2000 sccm, the pressure of the deposition chamber is 1.5 Torr, the temperature of the deposition chamber is 400 degrees C.

The atomic layer deposition process of forming an amorphous gate material layer of TiAlN over the gate dielectric layer of hafnium oxide comprises using $TiCl_4$, trimethylaluminum and $NH_3$ as reaction gases, the flow rate of $TiCl_4$ is 30 sccm, the flow rate of trimethylaluminum is 20 sccm, the flow rate of $NH_3$ is 100 sccm, the pressure of the deposition chamber is 1 Torr, and the temperature of the deposition is 350 degrees C. The formed amorphous gate material layer of TiAlN includes the percentage content of N atoms (having the smallest atomic radius) is 24%, the percentage content of the Ti atoms (having the largest atomic radius) is 15%, and the percentage content of Al atoms (having an atomic radius between the smallest and the largest atomic radii) is 61%.

Example 2

According to an embodiment of the present invention, a method for manufacturing a gate electrode includes providing a substrate, and forming gate dielectric layer of hafnium oxide ($HfO_2$) over the substrate by atomic layer deposition in a deposition chamber using $HfCl_4$ and $H_2O$ as reaction gases, and $N_2$ as the carrier gas, the flow rate of $HfCl_4$ is 100 sccm, the flow rate of $H_2O$ is 100 sccm, the flow rate of $N_2$ is 2000 sccm, the pressure of the deposition chamber is 1.5 Torr, the deposition temperature is 400 degrees C.

The atomic layer deposition process of forming an amorphous gate material layer of TiPC over the gate dielectric layer of hafnium oxide comprises using $TiCl_4$, $PH_3$, and $CH_4$ as reaction gases, Ar as the carrier gas, the flow rate of $TiCl_4$ is 5 sccm, the flow rate of $PH_3$ is 100 sccm, the flow rate of $CH_4$ is 10 sccm, the flow rate of Ar is 1000 sccm, the pressure of the deposition chamber is 2 Torr, and the temperature of the deposition is 400 degrees C. The formed amorphous gate material layer of TiPC includes the percentage content of C atoms (having the smallest atomic radius) is 10%, the percentage content of the Ti atoms (having the largest atomic radius) is 5%, and the percentage content of P atoms (having an atomic radius between the smallest and the largest atomic radii) is 85%.

Example 3

According to an embodiment of the present invention, a method for manufacturing a gate electrode includes providing a substrate, and forming gate dielectric layer of hafnium oxide ($HfO_2$) over the substrate by atomic layer deposition in a deposition chamber using $HfCl_4$ and $H_2O$ as reaction gases, and $N_2$ as the carrier gas, the flow rate of $HfCl_4$ is 100 sccm, the flow rate of $H_2O$ is 100 sccm, the flow rate of $N_2$ is 2000 sccm, the pressure of the deposition chamber is 5 Torr, and the deposition temperature is 400 degrees C.

The atomic layer deposition process of forming an amorphous gate material layer of WPC over the gate dielectric layer of hafnium oxide comprises using $WF_6$, $PH_3$, and $C_3H_4$ as reaction gases, Ar as the carrier gas, the flow rate of $WF_6$ is 20 sccm, the flow rate of $PH_3$ is 65 sccm, the flow rate of $C_3H_4$ is 10 sccm, the flow rate of Ar is 1500 sccm, the pressure of the deposition chamber is 2 Torr, and the temperature of the deposition is 350 degrees C. The percentage content of C atoms (having the smallest atomic radius) is about 40%, the content of the W atoms (having the largest atomic radius) is about 15%, and the percentage content of P atoms (having an atomic radius between the smallest and the largest atomic radii) is about 45% in the formed amorphous gate material layer of WPC.

Example 4

According to an embodiment of the present invention, a method for manufacturing a gate electrode includes providing a substrate, and forming gate dielectric layer of hafnium oxide ($HfO_2$) over the substrate by atomic layer deposition in a deposition chamber using $HfCl_4$ and $H_2O$ as reaction gases, and $N_2$ as the carrier gas, the flow rate of $HfCl_4$ is 100 sccm, the flow rate of $H_2O$ is 100 sccm, the flow rate of $N_2$ is 2000 sccm, the pressure of the deposition chamber is 5 Torr, and the deposition temperature is 400 degrees C.

The atomic layer deposition process of forming an amorphous gate material layer of TiPN over the gate dielectric layer of hafnium oxide comprises using $TiCl_4$, $PH_3$, and $NH_3$ as reaction gases, Ar as a carrier gas, the flow rate of $WF_6$ is 15 sccm, the flow rate of $PH_3$ is 20 sccm, the flow rate of $NH_3$ is 100 sccm, the flow rate of Ar is 2000 sccm, the pressure of the deposition chamber is 3 Torr, and the temperature of the deposition is 450 degrees C. The percentage content of N atoms (having the smallest atomic radius) is about 20%, the percentage content of the Ti atoms (having the largest atomic radius) is about 10%, and the percentage content of P atoms (having an atomic radius between the smallest and the largest atomic radii) is about 70% in the formed amorphous gate material layer of TiPN.

Example 5

According to an embodiment of the present invention, a method for manufacturing a gate electrode includes providing a substrate, and forming gate dielectric layer of hafnium oxide ($HfO_2$) over the substrate by atomic layer deposition in a deposition chamber using $HfCl_4$ and $H_2O$ as reaction gases, and $N_2$ as the carrier gas, the flow rate of $HfCl_4$ is 100 sccm, the flow rate of $H_2O$ is 100 sccm, the flow rate of $N_2$ is 2000 sccm, the pressure of the deposition chamber is 5 Torr, and the deposition temperature is 400 degrees C.

The atomic layer deposition process of forming an amorphous gate material layer of ZrCuAl over the gate dielectric layer of hafnium oxide comprises using $ZrCl_4$, $CuCl_2$, and trimethylaluminum (TMA) $Al_2(CH_3)_6$ as reaction gases, Ar as a carrier gas, the flow rate of $ZrCl_4$ is 15 sccm, the flow rate of $CuCl_2$ is 75 sccm, the flow rate of TMA is 50 sccm, the flow rate of Ar is 20 sccm, the pressure of the deposition chamber is 0.001 Torr, and the temperature of the deposition is 500 degrees C. The percentage content of Al atoms (having the smallest atomic radius) is about 20%, the content of the Zr atoms (having the largest atomic radius) is about 10%, and the percentage content of Cu atoms (having an atomic radius between the smallest and the largest atomic radii) is about 70% in the formed amorphous gate material layer of ZrCuAl.

Example 6

According to an embodiment of the present invention, a method for manufacturing a gate electrode includes providing a substrate, and forming gate dielectric layer of hafnium oxide ($HfO_2$) over the substrate by atomic layer deposition in a deposition chamber using $HfCl_4$ and $H_2O$ as reaction gases, and $N_2$ as the carrier gas, the flow rate of $HfCl_4$ is 100 sccm, the flow rate of $H_2O$ is 100 sccm, the flow rate of $N_2$ is 2000 sccm, the pressure of the deposition chamber is 5 Torr, and the deposition temperature is 400 degrees C.

The atomic layer deposition process of forming an amorphous gate material layer of TiAlW over the gate dielectric layer of hafnium oxide comprises using $TiCl_4$, trimethylaluminum (TMA) $Al_2(CH_3)_6$, and $WO_2$ as reaction gases, Ar as a carrier gas, the flow rate of $TiCl_4$ is 100 sccm, the flow rate of TMA is 30 sccm, the flow rate of $WO_2$ is 10 sccm, the flow rate of Ar is 2000 sccm, the pressure of the deposition chamber is 0.02 Torr, and the temperature of the deposition is 480 degrees C. The percentage content of Al atoms (having the smallest atomic radius) is about 20%, the percentage content of the Ti atoms (having the largest atomic radius) is about 10%, and the percentage content of W atoms (having an atomic radius between the smallest and the largest atomic radii) is about 70% in the formed amorphous gate material layer of TiAlW.

Comparative Example 1

According to an embodiment of the present invention, a method for manufacturing a gate electrode includes providing a substrate, and forming gate dielectric layer of hafnium oxide ($HfO_2$) over the substrate by atomic layer deposition in a deposition chamber using $HfCl_4$ and $H_2O$ as reaction gases, and $N_2$ as the carrier gas, the flow rate of $HfCl_4$ is 100 sccm, the flow rate of $H_2O$ is 100 sccm, the flow rate of $N_2$ is 2000 sccm, the pressure of the deposition chamber is 5 Torr, and the deposition temperature is 400 degrees C.

The process of forming a Cu gate material layer over the gate dielectric layer of hafnium oxide comprises using a copper pyrophosphate $Cu_2P_2O_7$ as an ion plating solution precursor, the plating current density is 2.5 $A/dm^2$, and the plating temperature is about 80 degrees C.

Table 1 shows the average threshold voltage of devices implemented in examples 1 through 6 and the comparative example 1.

TABLE 1

| | Average threshold voltage (V) |
|---|---|
| Example 1 | 0.91 |
| Example 2 | 0.89 |
| Example 3 | 0.95 |
| Example 4 | 0.93 |
| Example 5 | 0.95 |
| Example 6 | 0.92 |
| Comparative example 1 | 1.34 |

As is shown in Table 1, the average threshold voltage was in the range between 0.89 to 0.95 V, whereas the average threshold voltage of the comparative example 1 was 1.34 V. The average threshold voltage obtained from devices implemented in examples 1 through 6 was much lower than the average threshold voltage of the device of comparative example 1, this fact is attributed to the threshold voltage distribution of devices in examples 1 through 6.

Embodiments of the present invention provide many advantages and benefits. By forming a gate electrode having at least an amorphous gate metal layer, where the amorphous gate metal layer includes an amorphous metal alloy material layer or an amorphous metal compound material layer. Because the amorphous gate metal layer comprises at least two different atoms, an amorphous material can be easily formed between the different atoms, and thus facilitates the uniform distribution of the amorphous gate metal layer. Since the different atoms are randomly and evenly distributed in the amorphous gate metal layer, and there is no crystal grains and grain boundaries, thus, there are relatively few defects caused by a recombination of carriers in the amorphous gate metal layer so that the carrier mobility is increased, and the carrier can be uniformly distributed to solve the problems of non-uniform distribution of the threshold voltage.

The foregoing description has provided by way of exemplary and non-limiting examples a full description of the invention. However, various modifications and adaptations may become apparent to those skilled in the art in view of the foregoing description, when read in conjunction with the accompanying drawings and the appended claims. Thus, such and similar modifications of the teachings of the invention will fall within the scope of this invention.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a gate electrode, the method comprising:
   providing a substrate; and
   forming an amorphous gate metal layer on the substrate, the amorphous gate metal layer comprising:
   an amorphous metal alloy material layer having at least two metallic elements of an amorphous material, wherein the amorphous material comprises at least three different types of atoms each having an atomic radius, and a percentage difference in atomic radii between any two of the three atoms is greater than or equal to 10%; or
   an amorphous metal compound material layer having at least one metallic element and at least one non-metallic element selected from the IIIA group, the IVA group, and the VA group.

2. The method of claim 1, further comprising forming a plurality of amorphous gate metal layers made of a same material or of different materials.

3. The method of claim 1, further comprising, after forming the amorphous gate metal layer, forming a gate material layer on the amorphous gate metal layers, the gate material layer comprising polysilicon, Cu, or Al.

4. The method of claim 1, further comprising, prior to forming the amorphous gate metal layer, forming a gate dielectric layer on the substrate; wherein the amorphous gate metal layer is formed on the gate dielectric layer.

5. The method of claim 4, wherein forming the gate dielectric layer comprises an atomic layer deposition using $HfCl_4$ and $H_2O$ as a reactive gas, $N_2$ as a carrier gas, a flow rate of $HfCl_4$ in a range between 1 sccm and 100 sccm, a flow rate of $H_2O$ in a range between 1 sccm and 100 sccm, a flow rate of $N_2$ in a range between 1000 sccm and 3000 sccm, a pressure in a range between 0.1 Torr and 6 Torr, and a temperature in a range between 200 degrees C. and 500 degrees C.

6. The method of claim 1, wherein forming the amorphous gate metal layer comprises atomic layer deposition or chemical vapor deposition.

7. The method of claim 6, wherein the atomic layer deposition comprises a deposition temperature in a range between 200 and 450 degrees C., and a deposition pressure in a range between 0.1 and 6 Torr.

8. The method of claim 6, wherein the chemical vapor deposition comprises an energy in a range between 300 and 500 W, a deposition pressure in a range between 0.001 and 0.2 Torr, and a deposition temperature in a range between 200 and 500 degrees C.

9. A gate electrode comprising:
at least one amorphous gate metal layer comprising:
an amorphous metal alloy material layer having at least two metallic elements of an amorphous material; or
an amorphous metal compound material layer having at least one metallic element and at least one non-metallic element selected from the IIIA group, the IVA group, and the VA group,
wherein the amorphous material comprises at least three different types of atoms each having an atomic radius, and a percentage difference in atomic radii between any two of the three atoms is greater than or equal to 10%.

10. The gate electrode of claim 9, wherein the at least one metallic element is Ti, W, Cu, Al, Pd, Zr, La, or Ni.

11. The gate electrode of claim 9, wherein the at least one non-metallic element is nitrogen, carbon, phosphorus, or silicon.

12. The gate electrode of claim 9, wherein the at least one amorphous gate metal layer comprises a plurality of amorphous gate metal layers formed of a same material or of different materials.

13. The gate electrode of claim 9, wherein the amorphous metal alloy layer is a ZrCuAl material layer or a TiAlW material layer.

14. The gate electrode of claim 13, wherein a percentage content of atoms having a smallest radius is in a range between 10% and 40%, a percentage content of atoms having a largest radius is in a range between 5% and 15%, and a percentage content of atoms having an atomic radius between the smallest and largest radii is in a range 45% and 85% in the amorphous metal alloy material layer.

15. The gate electrode of claim 9, wherein the amorphous metal compound material layer is a TiAlN material layer, a TiPC material layer, a TiPN material layer, or a WPC material layer.

16. The gate electrode of claim 15, wherein a percentage content of atoms having a smallest radius is in a range between 10% and 40%, a percentage content of atoms having a largest radius is in a range between 5% and 15%, and a percentage content of atoms having an atomic radius between the smallest and largest radii is in a range 45% and 85% in the amorphous metal compound material layer.

17. The gate electrode of claim 9, further comprising a gate material layer on the amorphous gate metal layer.

18. The gate electrode of claim 17, wherein the gate material layer comprises polysilicon, Cu, or Al.

19. The gate electrode of claim 9, further comprising a gate dielectric layer having a high-k dielectric constant material disposed below the amorphous gate metal layer.

20. The gate electrode of claim 19, wherein the gate dielectric layer comprises $HfO_2$, HfON, HfSiON, $ZrO_2$, $La_2O_3$, or a combination thereof.

* * * * *